(12) United States Patent
Laufer

(10) Patent No.: US 6,466,633 B1
(45) Date of Patent: Oct. 15, 2002

(54) METHODS AND APPARATUS FOR IMPLEMENTING A RECEIVER FILTER WITH LOGARITHMIC COEFFICIENT MULTIPLICATION

(75) Inventor: Shaul Laufer, Petach Tikva (IL)

(73) Assignee: Shiron Satellite Communications (1996) Ltd., Petach (IL)

(*) Notice: Subject to any disclaimer, the term of this patent is extended or adjusted under 35 U.S.C. 154(b) by 102 days.

(21) Appl. No.: 09/653,009

(22) Filed: Aug. 31, 2000

(51) Int. Cl.$^7$ ............................. H04B 1/10; G06F 17/10
(52) U.S. Cl. ....................... 375/350; 708/300; 708/517
(58) Field of Search .................................. 375/350, 343; 708/300, 306, 316, 402, 517

(56) References Cited

U.S. PATENT DOCUMENTS 5,721,696 A * 2/1998 Pan et al. .................... 708/300
6,085,209 A * 7/2000 Pan ............................. 708/320

* cited by examiner

Primary Examiner—Temesghen Ghebretinsae

(74) Attorney, Agent, or Firm—Eitan, Pearl, Latzer, Cohen-Zedek

(57) ABSTRACT

A method of filtering a signal, the method including the steps of sampling analog input signal, thereby providing a purality of digital complex input signal samples the each of the samples indicates a sign and a magnitude, for each of the complex input signal samples demultiplexing the complex input signal sample into a first sign component and a first magnitude component, performing a logarithmic conversion on the first magnitude component, thereby resulting in a first logarithmic value, demultiplexing a complex coefficient into a second sign component and a second magnitude component, performing a logarithmic conversion on the second magnitude component, thereby resulting in a second logarithmic value, adding the first and second logarithmic values, thereby resulting in a third logarithmic value, performing an antilog conversion on the third logarithmic value, thereby resulting in an antilog value, XORing the first and second sign components, thereby resulting in an output sign, providing the antilog value as an output signal component having the output sign where both of the first and second magnitude components have nonzero values, and providing an output signal component having a zero value where either of the first and second magnitude components has a zero value, and summing the output signal components, thereby providing a filtered signal.

9 Claims, 4 Drawing Sheets

US 6,466,633 B1

METHODS AND APPARATUS FOR IMPLEMENTING A RECEIVER FILTER WITH LOGARITHMIC COEFFICIENT MULTIPLICATION

FIELD OF THE INVENTION

The present invention relates to digital signal processing in general, and in particular to methods and apparatus for implementing a receiver filter with logarithmic coefficient multiplication.

BACKGROUND OF THE INVENTION

Specialized computer processors dedicated for digital signal processing (DSP) applications are well known in the art and are widely used for a variety of purposes. These processors are particularly adapted to perform complex mathematical operations on signals. Such operations may include matrix multiplication, matrix-inversion, Fast Fourier Transforms (FFT), auto and cross correlation, Discrete Cosine Transforms (DCT), polynomial equations, and difference equations in general, such as those used to approximate Infinite Impulse Response (IIR) and Finite Impulse Response (FIR) filters.

DSP processors vary considerably in design and function. In general, the more complex the mathematical operations that a DSP processor is requited to perform, the more complex is its architecture. Simplifying the complexity of these mathematical operations will often result in the reduction of DSP processing hardware and software and an increase in processing speed. One such simplification approach targets the filtering of digital signals which requires extensive multiplication operations involving the addition of intermediate numerical results.

By way of example, consider a receiver filter where samples of received data $d_i$ are filtered by a FIR filter with coefficients $c_j$. The filter output $y_t$ is given according to the formula:

$$y_k = \sum_{j=0}^{N-1} d_{k-j} c_j$$

The complexity of the filters due to the large number of multiplications required, N operations for each sample. Each multiplication operation is a complex multiplication operation as $d_i$ and $c_j$ are usually complex numbers, thus requiring four real-number multiplication operations. For example, the multiplication of two complex numbers $x=x_R+x_I$ and $y=y_R+y_I$ is as follows:

$$xy=(x_R+jx_I)(y_R+jy_I)=x_R y_R-x_I y_I+j(x_I y_R+x_R y_I)$$

The multiplication of two real numbers may also be performed using the following relation;

$$ab = \begin{cases} \text{sign}(a)\text{sign}(b)\exp[\ln|a|+\ln|b|] & \text{if } a \neq 0 \text{ and } b \neq 0 \\ 0 & \text{otherwise} \end{cases}$$

The multiplication operation is much more complex than addition, thus addition is performed instead of multiplication. While this requires performing a logarithmic conversion of the result, an efficiency is realized due to the compression effect of the logarithmic operation. The quantization noise subsequent to the logarithmic operation is proportional to the signal, thus making is possible to decrease the number of quantization bits subsequent to the logarithmic operation.

Thus, the multiplications required for the filtering of digital signals may be simplified by supplanting the addition of intermediate numerical results with the addition of the logarithms of numbers to be added. An inverse logarithm or antilog operation may then be performed on the summation of the logarithms to yield the desired multiplication result.

SUMMARY OF THE INVENTION

The present invention seeks to provide improved methods and apparatus for implementing a receiver filter with logarithmic coefficient multiplication.

There is thus provided in accordance with a preferred embodiment of the present invention a method of filtering a signal, the method including the steps of sampling an analog input signal, thereby providing a plurality of digital complex input signal samples the each of the samples indicates a sign and a magnitude, for each of the complex input signal samples demultiplexing the complex input signal sample into a first sign component and a first magnitude component, performing a logarithmic conversion on the first magnitude component, thereby resulting in a first logarithmic value, demultiplexing a complex coefficient into a second sign component and a second magnitude component, performing a logarithmic conversion on the second magnitude component, thereby resulting in a second logarithmic value, adding the first and second logarithmic values, thereby resulting in a third logarithmic value, performing an antilog conversion on the third logarithmic value, thereby resulting in an antilog value, XORing the first and second sign components, thereby resulting in an output sign, providing the antilog value as an output signal component having the output sign where both of the first and second magnitude components have nonzero values, and providing an output signal component having a zero value where either of the first and second magnitude components has a zero value, and summing the output signal components, thereby providing a filtered signal.

Further in accordance with a preferred embodiment of the present invention the method includes the step of storing the plurality of complex input signal samples in a sample storage.

Still further in accordance with a preferred embodiment of the present invention the method includes the step of storing the complex coefficient in a coefficient storage.

There is also provided in accordance with a preferred embodiment of the present invention a method of filtering a signal, the method including the steps of sampling an analog input signal, thereby providing a plurality of digital complex input signal samples the each of the samples indicates a sign and a magnitude, for each of the complex input signal samples demultiplexing the complex input signal sample into a first sign component and a first magnitude component, performing a logarithmic conversion on the first magnitude component, thereby resulting in a first logarithmic value, demultiplexing a complex coefficient logarithmic value into a second sign component and a second magnitude component, the second magnitude component now referred to as a second logarithmic value, adding the first and second logarithmic values, thereby resulting in a third logarithmic value, performing an antilog conversion on the third logarithmic value, thereby resulting in an antilog value, XORing the first and second sign components, thereby resulting in an output sign, providing the analog value as an output signal component having the output sign where both of the first and second magnitude components have nonzero values, and providing au output signal component having a zero value where either of the first and second magnitude components has a zero value, and suing the output signal components, thereby providing a filtered signal.

Further in accordance with a preferred embodiment of the present invention the method includes the step of storing the plurality of complex input signal samples in a sample storage.

Still further in accordance with a preferred embodiment of the present invention the method includes the step of storing the complex coefficient logarithmic value in a coefficient storage.

Additionally in accordance with a preferred embodiment of the present invention the method includes the step of representing a zero value complex coefficient as the complex coefficient logarithmic value with a fixed combination of bits that is uniquely representative of the zero value.

There is additionally provided in accordance with a preferred embodiment of the present invention a signal filter including sampling means operative to receive a down-converted analog complex input signal including in-phase (I) and quadrature-phase (Q) signal channels and sample the analog input signal, thereby providing a plurality of digital complex input signal samples the each of the samples indicates a sign and a magnitude, first, second, third, and fourth real multipliers, each real multiplier including demultiplexing means operative to demultiplex each of the complex input signal samples into a first sign component and a first magnitude component and a corresponding complex coefficient into a second sign component and a second magnitude component, logarithmic conversion means operative to perform a logarithmic conversion on the first magnitude component, thereby resulting in a first logarithmic value and a logarithmic conversion on the second magnitude component, thereby resulting in a second logarithmic value, a first adder operative to add the first and second logarithmic values, thereby resulting in a third logarithmic value, antilog conversion means operative to perform an antilog conversion on the third logarithmic value, there resulting in an antilog value, XORing means operative to XOR the first and second sign components, thereby resulting in an output sign, zero detection means operative to detect a zero value for either of the first and second magnitude components and provide a zero value indicator, and multiplexing means operative to receive the output sign from the XORing apparatus, receive the zero value indicator from the zero detection apparatus, receive the antilog value from the antilog conversion apparatus, provide the antilog value as an output signal component having the output sign where both of the first and second magnitude components have nonzero values, and provide an output signal component having a zero value where either of the first and second magnitude components has a zero value, a second adder operative to sum the output signal components from the first and second real multipliers, a third adder operative to sum the output signal components from the third and fourth real multipliers, and a fourth adder operative to sum the summed output signal components from the second and third adders, thereby providing a filtered signal.

There is also provided in accordance with a preferred embodiment of the present invention a signal filter including sampling means operative to receive a down-converted analog complex input signal including in-phase (I) and quadrature-phase (Q) signal channels and sample the analog input signal, thereby providing a plurality of digital complex input signal samples the each of the samples indicates a sign and a magnitude, first, second, third, and fourth real multipliers, each real multiplier including demultiplexing means operative to demultiplex each of the complex input signal samples into a first sign component and a first magnitude component and a corresponding complex coefficient logarithmic value into a second sign component and a second magnitude component, the second magnitude component now referred to as a second logarithmic value, logarithmic conversion means operative to perform a logarithmic conversion on the first magnitude component, thereby resulting in a first logarithmic value, a first adder operative to add the first and second logarithmic values, thereby resulting in a third logarithmic value, antilog conversion means operative to perform an antilog conversion on the third logarithmic value, thereby resulting in an antilog value, XORing means operative to XOR the first and second sign components, thereby resulting in an output sign, zero detection means operative to detect a zero value for either of the first and second magnitude components and provide a zero value indicator, and multiplexing means operative to receive the output sign from the XORing apparatus, receive the zero value indicator from the zero detection apparatus, receive the antilog value from the antilog conversion apparatus, provide the antilog value as an output signal component having the output sign where both of the first and second magnitude components have nonzero values, and provide an output signal component having a zero value where either of the first and second magnitude components has a zero value, a second adder operative to sum the output signal components from the first and second real multipliers, a third adder operative to sum the output signal components from the third and fourth real multipliers, and a four adder operative to sum the summed output signal components from the second and third adders, thereby providing a filtered signal.

BRIEF DESCRIPTION OF THE DRAWINGS

The present invention will be understood and appreciated more fully from the following detailed description taken in conjunction with the appended drawings in which.

DETAILED DESCRIPTION OF PREFERRED EMBODIMENTS

Figure 1:
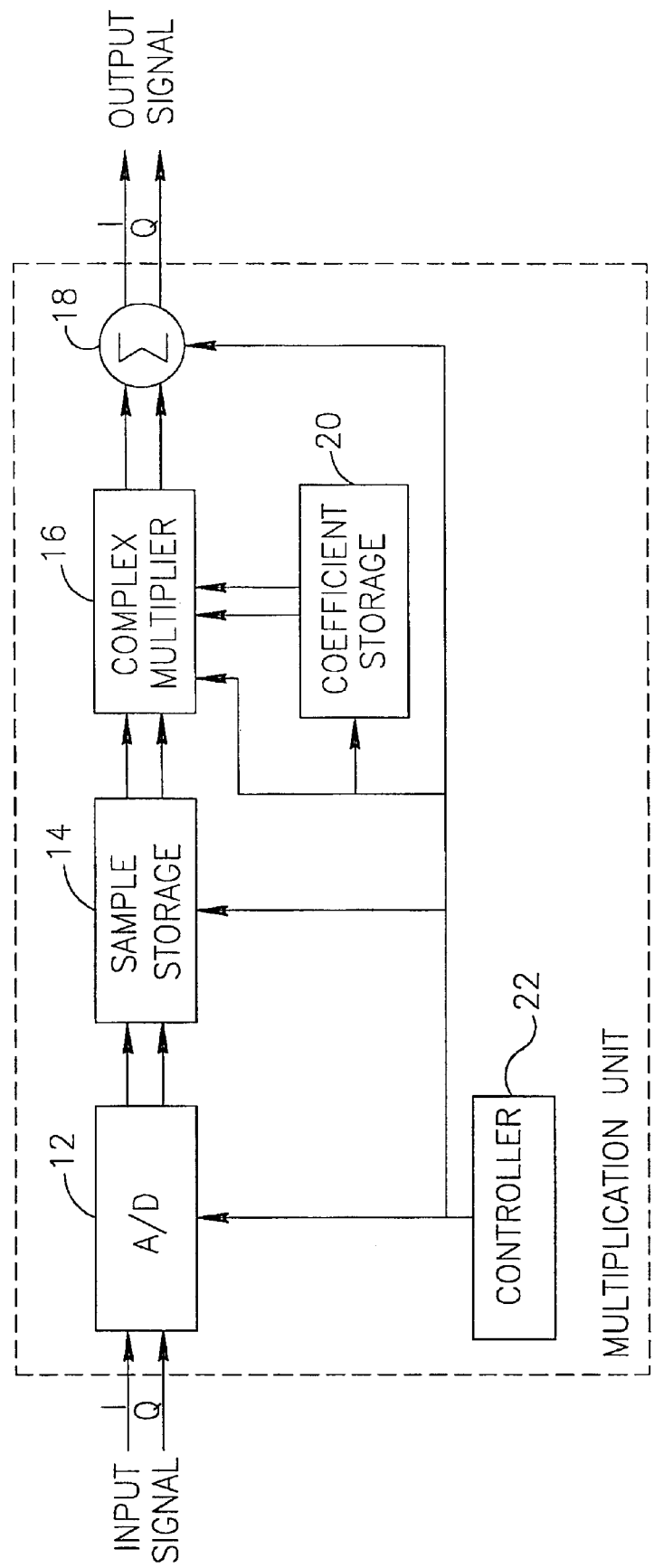
FIG. 1 is a simplified block diagram illustration of a receiver filter constructed and operative in accordance with a preferred embodiment of the present invention.

Reference is now made to FIG. 1 which is a simplified block diagram illustration of a receiver filter 10 constructed and operative in accordance with a preferred embodiment of the present invention. In the illustration a complex input signal, typically a baseband signal comprised of both in-phase (I) and quadrature-phase (Q) signal channels, is received at an analog-to-digital (A/D) converter 12 after having been down-converted from an intermediate frequency (IF). The I/Q signal is then sampled at converter 12, with $q_d$ bits of each sample representing the sample's sign and magnitude. The last N complex samples (N being the filter order) are then stored in a sample storage 14, typically being random-access memory (RAM), from which they are provided to a complex multiplier 16 in first-in-first-out (FIFO) fashion. Multiplier 16 multiplies the N samples with N coefficients stored in a coefficient storage 20, typically being read-only memory (ROM). The N complex multiplication results are then summed by an adder 18 and provided as an I/Q output signal. A controller 22 provides control signals to converter 12, storage 14, and adder 18 such that one conversion, input, and output operation respectively is performed for each sample. Controller 22 also controls storage 14 and 20, multiplier 16, and adder 18 such that N output, multiplication, and summation operations respectively are performed per sample.

Figure 2:
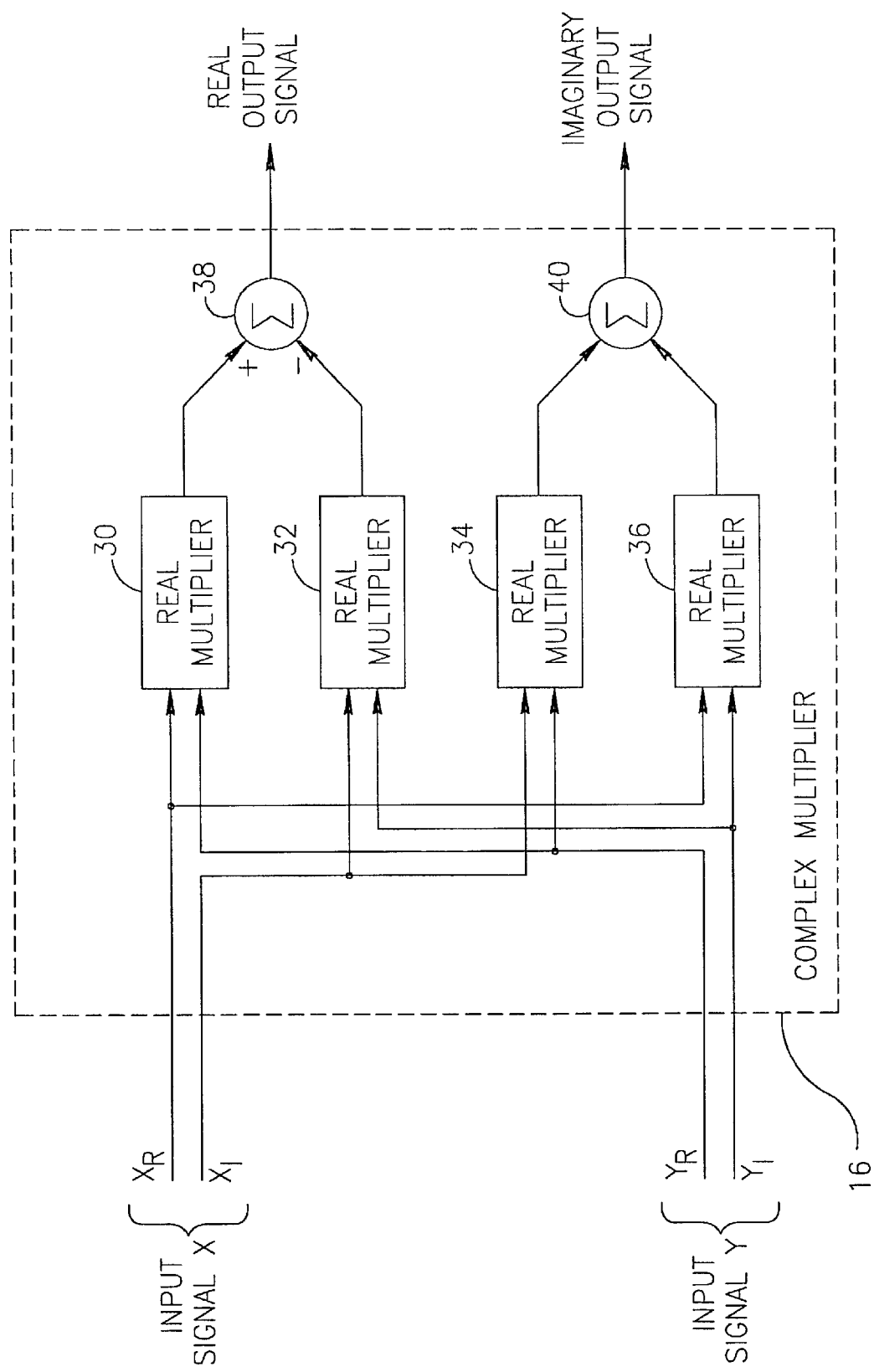
FIG. 2 is a simplified block diagram illustration of complex multiplier 16 of FIG. 1, constructed and operative in accordance with a preferred embodiment of the present invention.

Reference is now made to FIG. 2 which is a simplified block diagram illustration of complex multiplier 16 of FIG. 1, constructed and operative in accordance with a preferred embodiment of the present invention. In the illustration a complex sample comprising two complex numbers, referred to as input signal X, and a complex coefficient comprising two complex numbers, referred to as input signal Y, are input to complex multiplier 16. Signals X and Y are represented respectively by $x=x_R+x_I$ and $y=y_R+y_L$ and are multiplied by four real multipliers 30, 32, 34, and 36, according to the formulae:

$$\Re\{xy\}=x_Ry_R-x_Iy_I$$

$$\Im\{xy\}=x_Iy_R+x_Ry_I$$

with multiplier 30 providing $x_Ry_R$, multiplier 32 providing $x_Iy_I$, multiplier 34 providing $x_Iy_R$, and multiplier 36 providing $x_Ry_I$. The results of multipliers 30 and 32 are summed at an adder 38 and provided as a real output signal, while the results of multipliers 34 and 36 are summed at an adder 40 and provided as an imaginary output signal.

Figure 3:
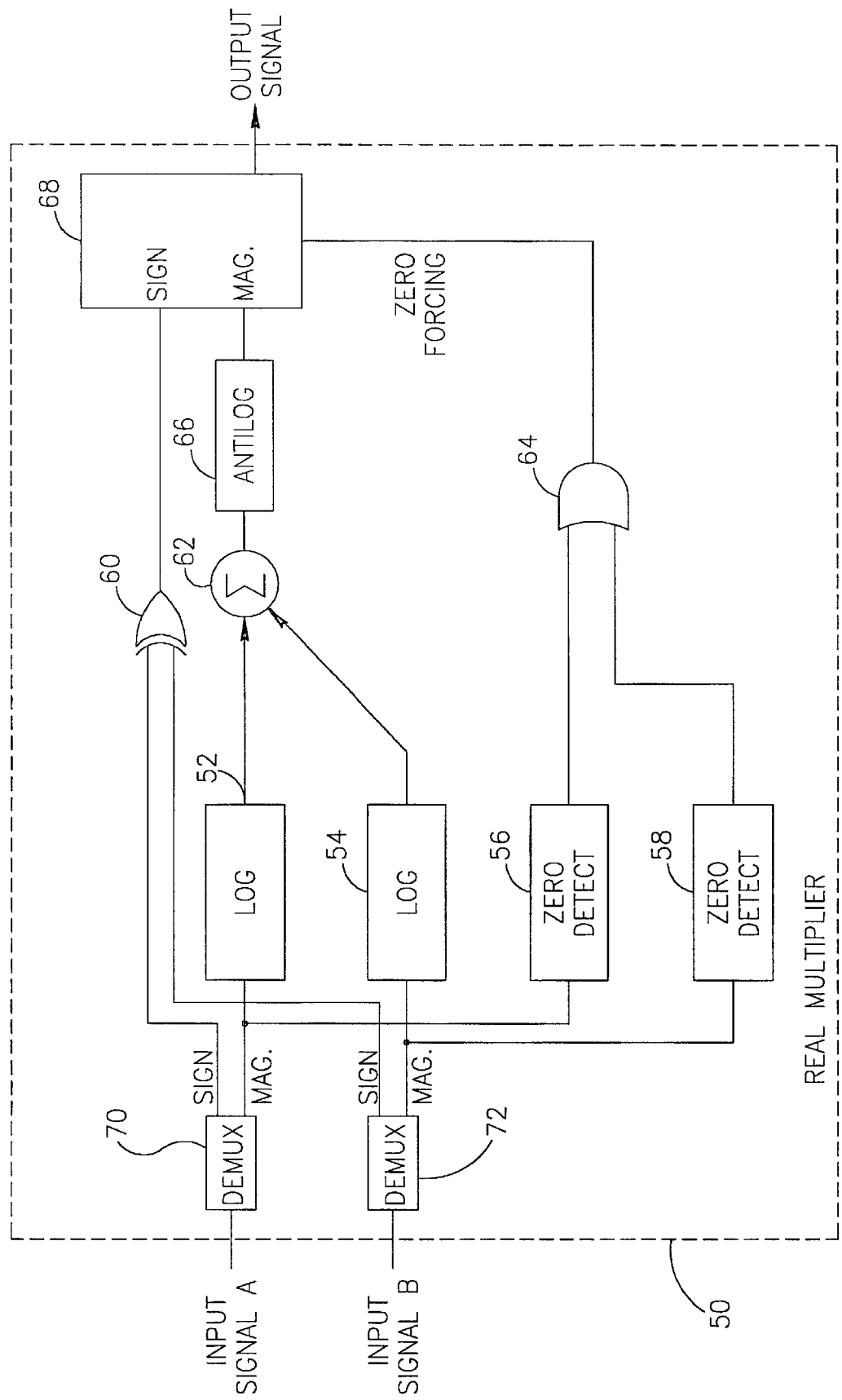
FIG. 3 is a simplified block diagram illustration of a real multiplier, constructed and operative in accordance with a preferred embodiment of the present invention.

Reference is now made to FIG. 3 which is a simplified block diagram illustration of a real multiplier 50, constructed and operative in accordance with a preferred embodiment of the present invention. The embodiment shown for real multiplier 50 may be used for any of real multipliers 30, 32, 34, and 36 shown in FIG. 2. In the illustration two input signals A and B representing sample and coefficient values respectively of input signals X and Y (FIG. 2) are received by real multiplier 30. Input signals A and B have quantization values with $q_a$ and $q_b$ bits respectively, with the signal magnitudes a and b of A and B typically being represented by $q_a-1$ and $q_b-1$ bits respectively and each value's sign represented by one bit. Input signals A and B are demultiplexed into their sign and magnitude components by demultiplexers 70 and 72 respectively. The magnitudes of each of input signals A and B are converted to their logarithmic values log{a} and log{b} respectively at logarithmic units 52 and 54 to a resolution of $q_{log}(a)-1$ and $q_{log}(b)-1$ bits respectively. The logarithmic values are then provided to an adder 62 where they are summed. An antilog unit 66 then calculates the inverse logarithmic value of the summed result of adder 62 and provides the value to a buffer 68.

The bits representing the signs of input signals A and B are XORed at an XOR unit 60 to yield the sign of the multiplication result which is provided to buffer 68. The input signal magnitudes are input to zero detection units 56 and 58 which output a zero value indicator, such as a zero value, where the input signal magnitude is zero. The output from zero detection units 56 and 58 are then ORed at an OR unit 64 whose result is provided to buffer 68. Where neither of input signals A and B are zero buffer 68 provides the multiplication result as an output signal component having the sign as per XOR unit 60. Where either of input signals A and B are zero buffer 68 provides an output signal component having a zero value.

Figure 4:
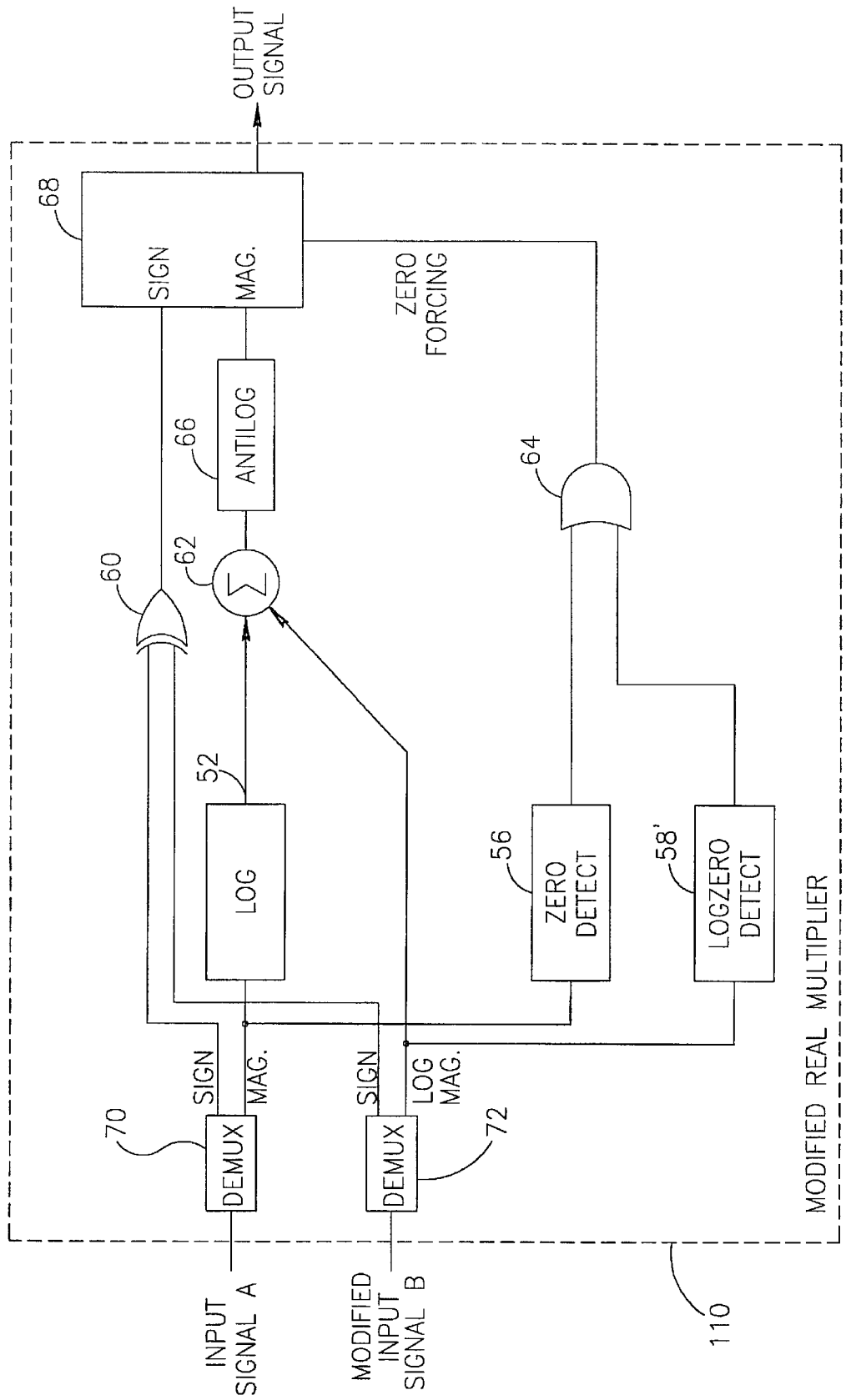
FIG. 4 which is a simplified block diagram illustration of a real multiplier, constructed and operative in accordance with another preferred embodiment of the present invention.

Reference is now made to FIG. 4 which is a simplified block diagram illustration of a real multiplier 110, constructed and operative in accordance with another preferred embodiment of the present invention. The embodiment shown for real multiplier 110 may be used for any of real multipliers 30, 32, 34, and 36 shown in FIG. 2. Real multiplier 110 is identical in construction and operation to real multiplier 50 except as is now noted, In the embodiment shown the logarithmic values of the coefficients are stored in coefficient storage 20 (FIG. 1) and are provided as such to real multiplier 110 as input signal B, thus eliminating the need for logarithmic conversion of the coefficients by real multiplier 110. Since the number zero has no logarithmic value, a fixed combination of bits, such as 111 . . . 1, is preferably used to represent a value of zero in coefficient storage 20 and is used by a logzero detection unit 58' to detect a zero value. This fixed combination of bits is not used to represent a value other tan zero.

The methods and apparatus disclosed herein have been described without reference to specific hardware or software. Rather, the methods and apparatus have been described in a manner sufficient to enable persons of ordinary skill in the art to readily adapt commercially available hardware and software as may be needed to reduce any of the embodiments of the present invention to practice without undue experimentation and using conventional techniques.

While the present invention has been described with reference to a few specific embodiments, the description is intended to be illustrative of the invention as a whole and is not to be construed as limiting the invention to the embodiments shown. It is appreciated that various modifications may occur to those skilled in the art that, while not specifically shown herein, are nevertheless within the true spirit and scope of the invention.

We claim:

1. A method of filtering a signal, the method comprising the steps of:

sampling an analog input signal, thereby providing a plurality of digital complex input signal samples wherein each of said samples indicates a sign and a magnitude;

for each of said complex input signal samples:

demultiplexing said complex input signal sample into a first sign component and a first magnitude component;

performing a logarithmic conversion on said first magnitude component, thereby resulting in a first logarithmic value;

demultiplexing a complex coefficient into a second sign component and a second magnitude component;

performing a logarithmic conversion on said second magnitude component, thereby resulting in a second logarithmic value;

adding said first and second logarithmic values, thereby resulting in a third logarithmic value;

performing an antilog conversion on said third logarithmic value, thereby resulting in an antilog value;

XORing said first and second sign components, thereby resulting in an output sign;

providing said antilog value as an output signal component having said output sign where both of said first and second magnitude components have non-zero values; and providing an output signal component having a zero value where either of said first and second magnitude components has a zero value; and summing said output signal components, thereby providing a filtered signal.

2. A method according to claim 1 and further comprising the step of storing said plurality of complex input signal samples in a sample storage.

3. A method according to claim 1 and further comprising the step of storing said complex coefficient in a coefficient storage.

4. A method of filtering a signal, the method comprising the steps of:

sampling al analog input signal, thereby providing a plurality of digital complex input signal samples wherein each of said samples indicates a sign and a magnitude;

for each of said complex input signal samples:

demultiplexing said complex input signal sample into a first sign component and a first magnitude component;

performing a logarithmic conversion on said first magnitude component, thereby resulting in a first logarithmic value;

demultiplexing a complex coefficient logarithmic value into a second sign component and a second magnitude component, said second magnitude component now referred to as a second logarithmic value;

adding said first and second logarithmic values, thereby resulting in a third logarithmic value;

performing an antilog conversion on said third logarithmic value, thereby resulting in an antilog value;

XORing said first and second sign components, thereby resulting in an output sign;

providing said antilog value as an output signal component having said output sign where both of said first and second magnitude components have non-zero values; and providing an output signal component having a zero value where either of said first and second magnitude component has a zero value; and summing said output signal components, thereby providing a filtered signal.

5. A method according to claim 4 and further comprising the step of storing said plurality of complex input signal samples in a sample storage.

6. A method according to claim 4 and further comprising the step of storing said complex coefficient logarithmic value in a coefficient storage.

7. A method according to claim 4 and further comprising the step of representing a zero value complex coefficient as said complex coefficient logarithmic value with a fixed combination of bits that is uniquely representative of said zero value.

8. A signal filter comprising:

sampling means operative to receive a down-converted analog complex input signal comprising in-phase (I) and quadrature-phase (Q) signal channels and sample said analog input signal, thereby providing a plurality of digital complex input signal samples wherein each of said samples indicates a sign and a magnitude;

first, second, third, and fourth real multipliers, each real multiplier comprising:

demultiplexing means operative to demultiplex each of said complex input signal samples into a first sign component and a first magnitude component and a corresponding complex coefficient into a second sign component and a second magnitude component;

logarithmic conversion means operative to perform a logarithmic conversion on said first magnitude component, thereby resulting in a first logarithmic value and a logarithmic conversion on said second magnitude component, thereby resulting in a second logarithmic value;

a first adder operative to add said first and second logarithmic values, thereby resulting in a third logarithmic value;

antilog conversion means operative to perform an antilog conversion on said third logarithmic value, thereby resulting in an antilog value;

XORing means operative to XOR said first and second sign components, thereby resulting in an output sign;

zero detection means operative to detect a zero value for either of said first and second magnitude components and provide a zero value indicator, and multiplexing means operative to:

receive said output sign from said XORing means;

receive said zero value indicator from said zero detection means;

receive said antilog value from said antilog conversion means;

provide said antilog value as an output signal component having said output sign where both of said first and second magnitude components have nonzero values; and provide an output signal component having a zero value where either of said first and second magnitude components has a zero value;

a second adder operative to sum said output signal components from said first and second real multipliers;

a third adder operative to sum said output signal components from said third and fourth real multipliers; and a fourth adder operative to sum said summed output signal components from said second and third adders, thereby providing a filtered signal.

9. A signal filter comprising:

sampling means operative to receive a down-converted analog complex input signal comprising in-phase (I) and quadraturephase (Q) signal channels and sample said analog input signal, thereby providing a plurality of digital complex input signal samples wherein each of said samples indicates a sign and a magnitude;

first, second, third, and fourth real multipliers, each real multiplier comprising:

demultiplexing means operative to demultiplex each of said complex input signal samples into a first sign component and a first magnitude component and a corresponding complex coefficient logarithmic value into a second sign component and a second magnitude component, said second magnitude component now referred to as a second logarithmic value;

logarithmic conversion means operative to perform a logarithmic conversion on said first magnitude component, thereby resulting in a first logarithmic value;

a first adder operative to add said first and second logarithmic values, thereby resulting in a third logarithmic value;

antilog conversion means operative to perform an antilog conversion on said third logarithmic value, thereby resulting in an antilog value;

XORing means operative to XOR said first and second sign components, thereby resulting in an output sign;

zero detection means operative to detect a zero value for either of said first and second magnitude components and provide a zero value indicator; and multiplexing means operative to:
   receive said output sign from said XORing means;
   receive said zero value indicator from said zero detection means;
   receive said antilog value from said antilog conversion means;
   provide said antilog value as an output signal component having said output sign where both of said it and second magnitude components have nonzero values; and
   provide an output signal component having a zero value where either of said first and second magnitude components has a zero value;

a second adder operative to sum said output signal components from said first and second real multipliers;

a third adder operative to sum said output signal components from said third and fourth real multipliers; and a fourth adder operative to sum said summed output signal components from said second and third adders, thereby providing a filtered signal.

\* \* \* \* \*